(12) United States Patent
Sakamoto

(10) Patent No.: US 8,859,338 B2
(45) Date of Patent: Oct. 14, 2014

(54) METHOD OF MANUFACTURING A SEMICONDUCTOR DEVICE AND SEMICONDUCTOR DEVICE

(71) Applicant: Ken Sakamoto, Tokyo (JP)

(72) Inventor: Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/773,343

(22) Filed: Feb. 21, 2013

(65) Prior Publication Data

US 2013/0341779 A1  Dec. 26, 2013

(30) Foreign Application Priority Data

Jun. 25, 2012 (JP) ................................. 2012-141649

(51) Int. Cl.
| | |
|---|---|
| H01L 21/60 | (2006.01) |
| H01L 21/56 | (2006.01) |
| H01L 23/495 | (2006.01) |
| H01L 21/48 | (2006.01) |

(52) U.S. Cl.
CPC .......... *H01L 21/56* (2013.01); *H01L 23/49575* (2013.01); *H01L 2924/0002* (2013.01); *H01L 21/4842* (2013.01); *H01L 23/495* (2013.01)
USPC ..................... 438/123; 257/670; 257/E23.043

(58) Field of Classification Search
CPC ..... H01L 21/48; H01L 21/4842; H01L 21/56; H01L 23/495; H01L 23/49555; H01L 23/49558
USPC .................... 257/669, 670, E23.043; 438/123
See application file for complete search history.

(56) References Cited

U.S. PATENT DOCUMENTS

| | | | |
|---|---|---|---|
| 5,999,413 A | 12/1999 | Ohuchi et al. | |
| 6,569,764 B1 * | 5/2003 | Hirashima et al. | ............ 438/673 |
| 6,724,072 B2 * | 4/2004 | Ochiai et al. | .................. 257/667 |
| 7,102,211 B2 * | 9/2006 | Ochiai et al. | .................. 257/666 |
| 2006/0141672 A1 * | 6/2006 | Kobayakawa | ................ 438/123 |

FOREIGN PATENT DOCUMENTS

| | | | | |
|---|---|---|---|---|
| JP | 63070548 A | * | 3/1988 | |
| JP | 01030237 A | * | 2/1989 | |
| JP | 02178955 A | * | 7/1990 | |
| JP | 05-144988 A | | 6/1993 | |
| JP | 06-232309 A | | 8/1994 | |
| JP | 06-283642 A | | 10/1994 | |
| JP | 10-012641 A | | 1/1998 | |
| JP | 2000-058733 A | | 2/2000 | |
| KR | 10-1998-0070254 A | | 10/1998 | |

OTHER PUBLICATIONS

An Office Action issued by the Korean Patent Office on Jun. 18, 2014, which corresponds to Korean Patent Application No. 10-2013-0049738 and is related to U.S. Appl. No. 13/773,343; with English language partial translation.

* cited by examiner

*Primary Examiner* — Allan R Wilson

(74) *Attorney, Agent, or Firm* — Studebaker & Brackett PC

(57) ABSTRACT

A method of manufacturing a semiconductor device includes a sealing step of sealing an inner lead of a lead frame with a resin, and a bending step of bending a target bending region in which a stress by bending is not applied to a resin burr generated in the sealing step.

10 Claims, 6 Drawing Sheets

(a)

(b)

METHOD OF MANUFACTURING A SEMICONDUCTOR DEVICE AND SEMICONDUCTOR DEVICE

BACKGROUND OF THE INVENTION

1. Field of the Invention

The present invention relates to a method of manufacturing a semiconductor device and a semiconductor device in which resin burrs are taken into consideration.

2. Description of the Background Art

In manufacturing a package of a power semiconductor, lead forming (bending) needs to be performed in accordance with engineering drawings of the package. Japanese Patent Application Laid-Open No. 06-232309 (1994) and Japanese Patent Application Laid-Open No. 06-283642 (1994) disclose the technology of performing bending (hereinafter, related art A).

In the related art A, however, lead forming (bending) is performed without consideration of a region in which a resin burr of a semiconductor package occurs. This incurs a problem that in the related art A, a resin burr tends to drop due to a bending stress of a lead in lead forming.

The dropped resin burr may cause increases of malfunctions of products and devices as, for example, foreign materials in a production line. In a case where a resin burr drops to a bonding surface with a fin, adhesion with the fin degrades, and heat dissipation properties degrade, leading to a reduction in reliability of a product. That is, dropping of a resin burr is a serious problem in lead forming (bending).

SUMMARY OF THE INVENTION

An object of the present invention is to provide a method of manufacturing a semiconductor device and the like capable of preventing a resin burr from dropping in bending.

A method of manufacturing a semiconductor device according to an embodiment of the present invention includes the steps of: sealing an inner lead of a lead frame with a resin; and bending a target bending region in which a stress by the bending is not applied to a resin burr generated in the step of sealing, the target bending region being subjected to bending in at least one terminal included in the lead frame.

The method of manufacturing a semiconductor device according to the present invention includes the steps of sealing the inner lead of the frame with a resin and bending a target bending region in which a stress by bending is not applied to a resin burr generated in the step of sealing.

Accordingly, a stress is not applied to a resin burr in bending, which enables to prevent the resin burr from dropping. Therefore, the resin burr can be prevented from dropping in bending.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
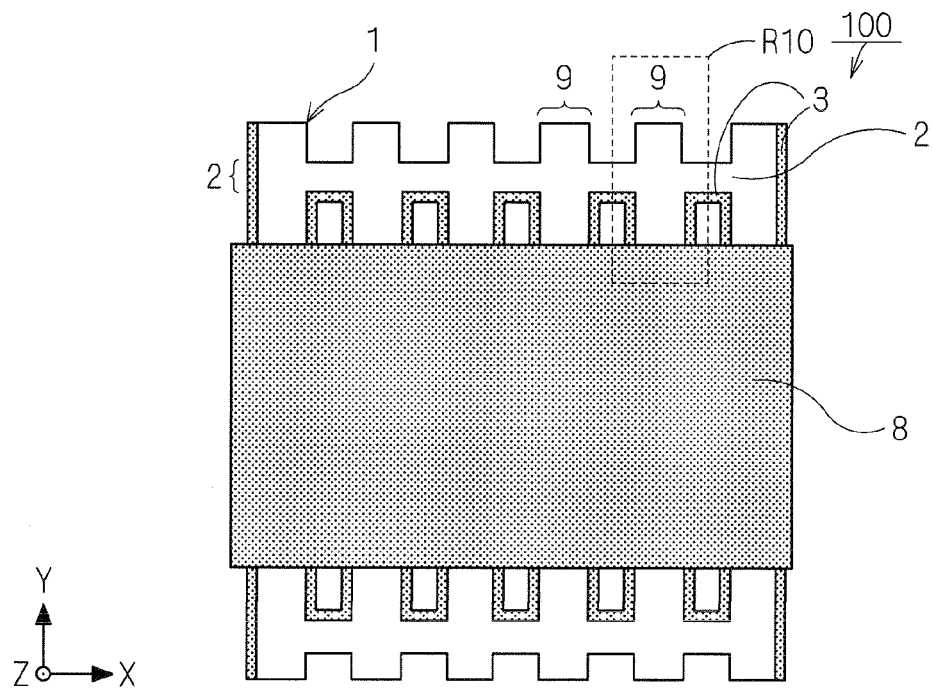
FIG. 1 is a schematic view of a semiconductor device according to a first preferred embodiment.

Hereinbelow, preferred embodiments of the present invention are described with reference to the drawings. In the following description, like references denote similar elements, which holds true for the names and functions thereof. Thus, detailed descriptions thereof are omitted at times.

The dimensions, materials, and shapes of components and relative arrangements thereof illustrated in the preferred embodiments may be appropriately changed depending on the configurations of devices to which the present invention is applied and various conditions, and the present invention is not limited to those illustrations. Also, the dimensions of the components in the drawings may differ from actual dimensions.

Comparative Example

Hereinbelow, a method of manufacturing a semiconductor device according to a comparative example is described.

Figure 12:
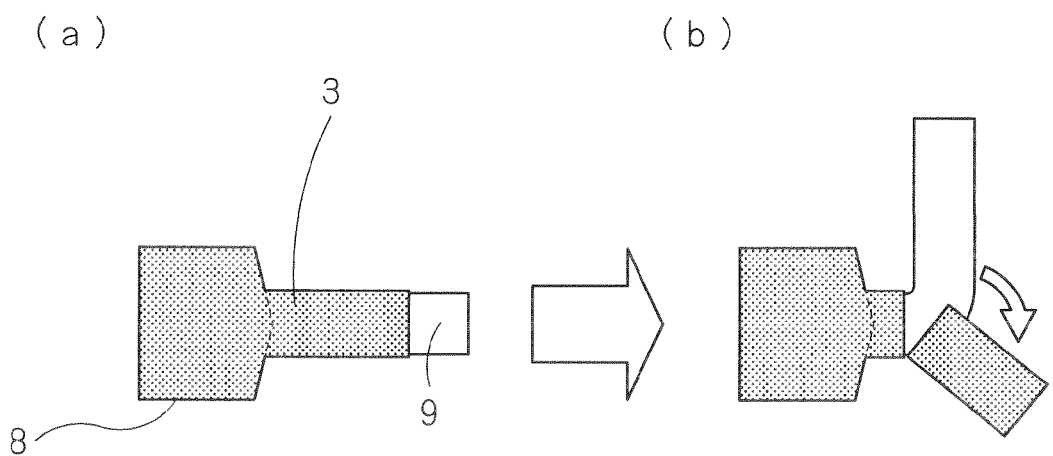
FIG. 12 is a view for describing a problem inherent in bending of a method of manufacturing a semiconductor device as a comparative example.

FIG. 12 is a view for describing a problem inherent in bending of a method of manufacturing a semiconductor device according to the comparative example. Part (a) in FIG. 12 shows the state of a terminal 9 before being subjected to bending. Part (b) in FIG. 12 is a view for showing the state of the terminal 9 during bending is performed.

With reference to Part (a) in FIG. 12, a resin burr 3 occurs on the periphery of a package 8 produced in a sealing step. Therefore, if the terminal 9 is subjected to bending without consideration of a region in which the resin burr 3 has occurred, as shown in Part (b) in FIG. 12, the resin burr 3 cracks and drops.

First Preferred Embodiment

This preferred embodiment solves the problem described in the comparative example above.

FIG. 1 is a schematic view (outline view) of a semiconductor device 100 according to the first preferred embodiment. The semiconductor device 100 is a power semiconductor. The semiconductor device 100 is not limited to a power semiconductor and may be a semiconductor for another use.

FIG. 1 also shows the configuration of the semiconductor device 100 that has been subjected to a sealing step described below and yet to be subjected to a cutting step described below.

In FIG. 1, X, Y, and Z directions are orthogonal to each other. X, Y, and Z directions in the following drawings are also orthogonal to each other. Hereinbelow, the direction including the X direction and the direction (−X direction) opposite to the X direction is also referred to as an X-axis direction, the direction including the Y direction and the direction (−Y direction) opposite to the Y direction is also referred to as a Y-axis direction, and the direction including the Z direction and the direction (−Z direction) opposite to the Z direction is also referred to as a Z-axis direction.

As shown in FIG. 1, the semiconductor device 100 includes a package 8 and a lead frame 1. The lead frame 1 in the package 8 is referred to as an inner lead. The lead frame 1 outside the package 8 is referred to as an outer lead.

Most of the package 8 is formed of a resin. The lead frame 1 includes a plurality of terminals 9 and a tie bar 2. The terminals 9 extend in the Y-axis direction. The tie bar 2 extends in a predetermined direction (X-axis direction) so as to connect the plurality of terminals 9. That is, the tie bar 2 extends in the direction (X-axis direction) perpendicular to the direction in which the terminals 9 extend and connects the terminals 9. That is, the tie bar 2 connects the plurality of terminals 9 included in the lead frame 1. Part of the tie bar 2 is included in the terminal 9. A resin burr 3 adheres to part of the lead frame 1.

Figure 2:
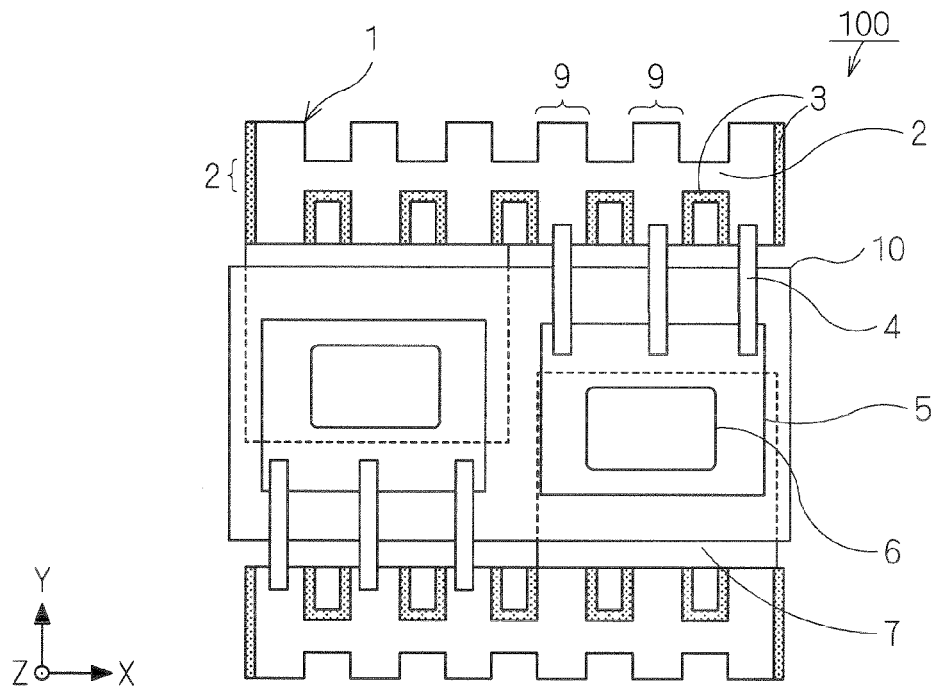
FIG. 2 is a view showing the internal structure of the semiconductor device according to the first preferred embodiment.

FIG. 2 is a view showing the internal structure of the semiconductor device 100 according to the first preferred embodiment. FIG. 2 shows the configuration of the semiconductor device 100 that has been subjected to the sealing step described below and yet to be subjected to the cutting step described below.

As shown in FIG. 2, the semiconductor device 100 further includes a die pad 10 and chips 5.

The chips 5 are mounted in the die pad 10. The electrode pad (not shown) of the chip 5 and the lead frame 1 are electrically connected via wires 4. Connected to the chip 5 via solder 6 is an inner lead 7. The inner lead 7 is part of the lead frame 1. The die pad 10, the wires 4, the chips 5, and the inner lead 7 are sealed with a resin, whereby the package 8 is formed.

Next, a method of manufacturing the semiconductor device 100 (hereinbelow, also referred to as a semiconductor manufacturing process) is described.

Figure 3:
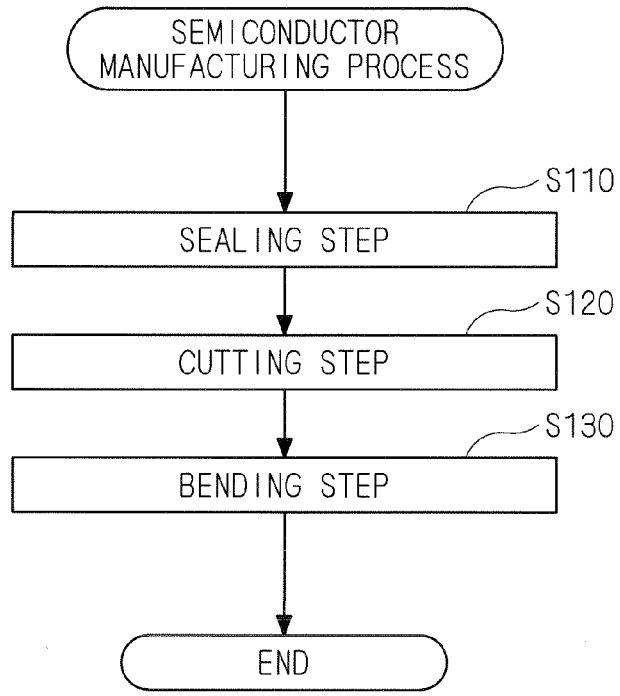
FIG. 3 is a flowchart of a semiconductor manufacturing process.

FIG. 3 is a flowchart of the semiconductor manufacturing process. In the semiconductor manufacturing process, the process regarding the present invention in the course of manufacturing a semiconductor is mainly described, and other general processes are not described.

First, the sealing step is performed (S110). In the sealing step, the die pad 10, the wires 4, the chips 5, the inner lead 7, and the like are sealed with a resin. That is, in the sealing step, components (such as die pad 10, wires 4, and chips 5) to be connected to the plurality of terminals 9 included in the lead frame 1 are sealed with a resin. The sealing with a resin is performed by a general transfer molding process.

The package 8 is formed through the sealing step. As shown in FIG. 1, the resin burrs 3 adhere to the periphery portion of the package 8 in the lead frame 1. That is, the resin burrs 3 are formed adjacent to the package 8.

Next, the cutting step is performed (S120). In the cutting step, the tie bar 2 located between the neighboring two terminals 9 is cut. As a result, each of the terminals 9 serves as an individual terminal including the tie bar 2.

Figure 4:
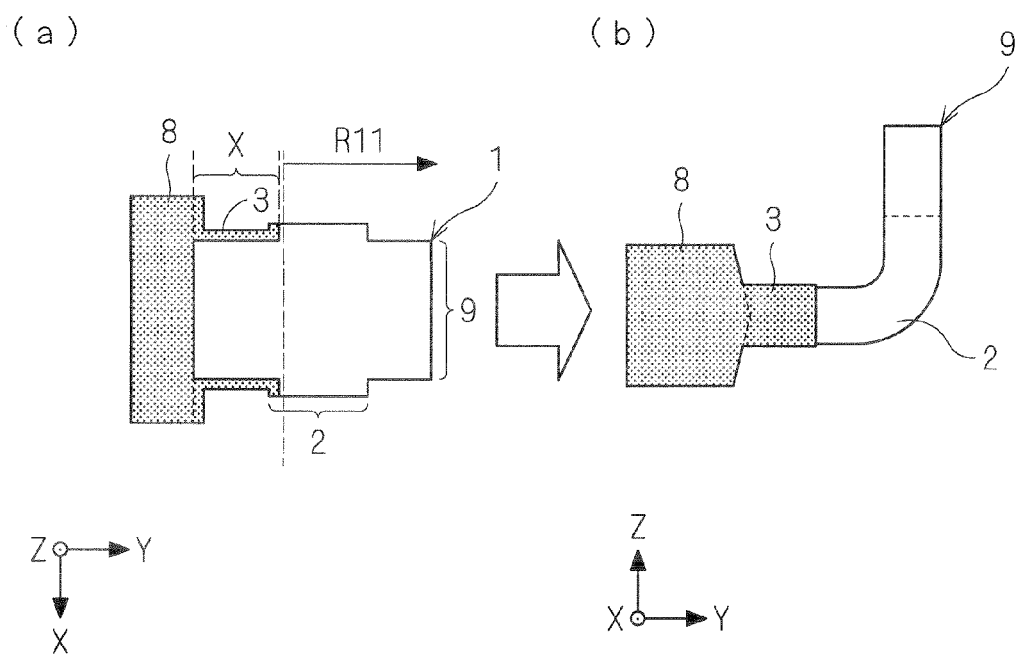
FIG. 4 is a view for describing bending.

Next, a bending step (S130) is performed. In the bending step, a target bending region in the lead frame 1 is subjected to bending. Part (a) in FIG. 4 is an enlarged view of a region R10 of FIG. 1 after the cutting step has been performed. Here, the target bending region is located within the region R11 in Part (a) in FIG. 4. The target bending region is the region subjected to bending in the terminal 9, and also is the region in which a stress due to bending is not applied to the resin burr 3 caused in the sealing step described above. Part (b) in FIG. 4 shows the terminal 9 in which the target bending region has been subjected to bending.

The predetermined direction (X-axis direction) in which the tie bar 2 extends is orthogonal to the direction in which the target bending region is bent in bending.

Hereinbelow, the region in which the resin burr 3 is present is also referred to as a resin burr region X. The region R11 in Part (a) in FIG. 4 is located on the tip side with respect to the resin burr region X in the lead frame 1 (terminal 9).

Figure 5:
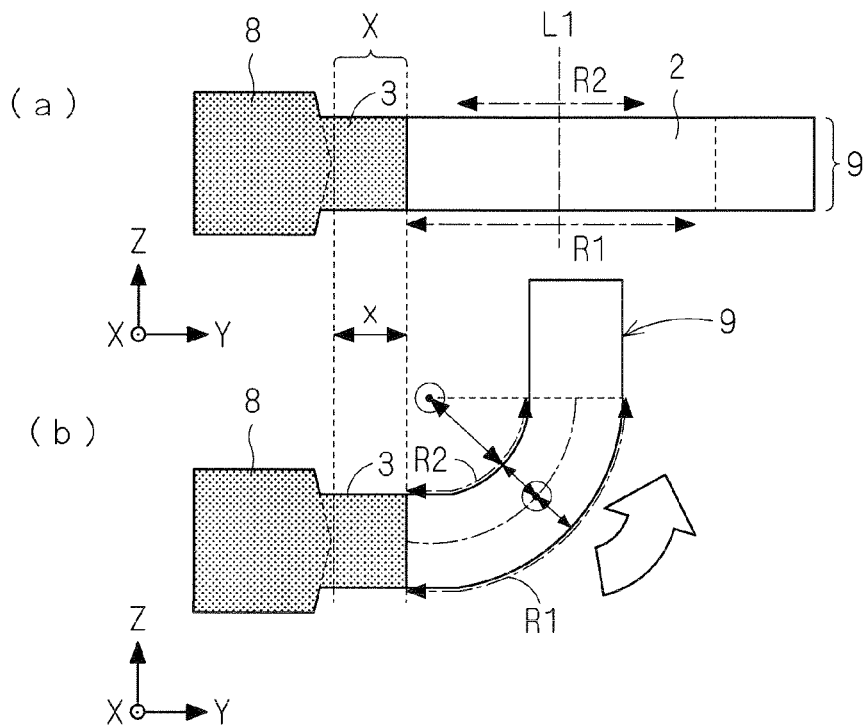
FIG. 5 is a view for specifically describing bending.

FIG. 5 is a view for specifically describing bending. Part (a) in FIG. 5 shows the terminal 9 before being subjected to bending and the periphery of the terminal 9. Part (b) in FIG. 5 shows the state of the terminal 9 that has been subjected to bending. Hereinbelow, the target bending region in the terminal 9, which has been subjected to bending, is also referred to as a bent region.

Hereinbelow, the region in the target bending region, which is located on the outer side (on the outer surface) of the terminal 9 bent in bending, is also referred to as an outer bending region R1. That is, the outer bending region R1 is a region in the target bending region, which has a large radius of curvature by bending. Hereinbelow, meanwhile, the region in the target bending region, which is located on the inner side (on the inner surface) of the terminal 9 bent in bending, is also referred to as an inner bending region R2.

The outer bending region R1 is a region having the largest distance through bending. The inner bending region R2 is a region having the smallest distance through bending.

The terminal 9 in Part (a) in FIG. 5 is bent such that the tip portion of the terminal 9 is directed toward the Z direction as shown in Part (b) in FIG. 5 around a bending axis L1. In this case, the outer bending region R1 and the inner bending region R2 with respect to the bending axis L1 are located as shown in Part (a) in FIG. 5.

In this preferred embodiment, bending is performed in the bending step such that the outer bending region R1 does not overlap the resin burr region X. In this preferred embodiment, in the bending step, the target bending region is located in the tie bar 2 included in the terminal 9 that has been subjected to the cutting step. In this preferred embodiment, the width in the Y-axis direction of the tie bar 2 is set to a size such that the outer bending region R1 does not overlap the resin burr region X in which the resin burr 3 is present. In this case, through the bending step, the terminal 9 changes as shown in Part (b) in FIG. 4 and Part (b) in FIG. 5.

Accordingly, a stress by bending (lead bending stress) is not applied to the resin burr 3 in the bending step, which enables to prevent the resin burr 3 from cracking. Therefore, the resin burr 3 can be prevented from dropping in bending.

Figure 6:
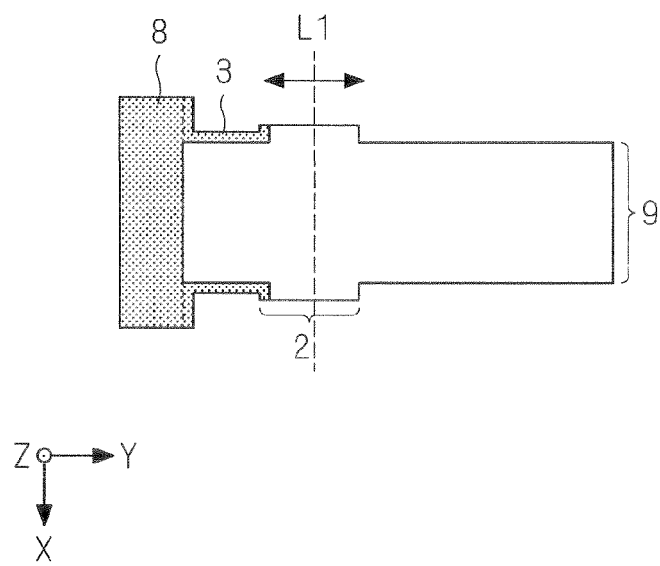
FIG. 6 is a view showing a position of a bending axis in bending.

As shown in FIG. 6, in the bending step, the bending axis L1 in bending may be a center portion (substantially the center) in the width direction (Y-axis direction) of the tie bar 2.

Figure 7:
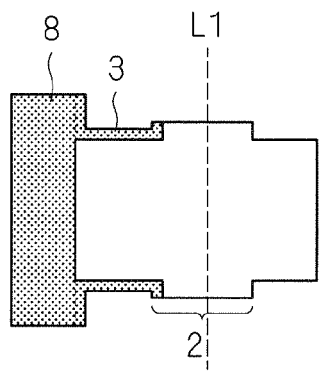
FIG. 7 is a view for describing bending.
Figure 7:
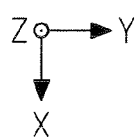
Figure 7:
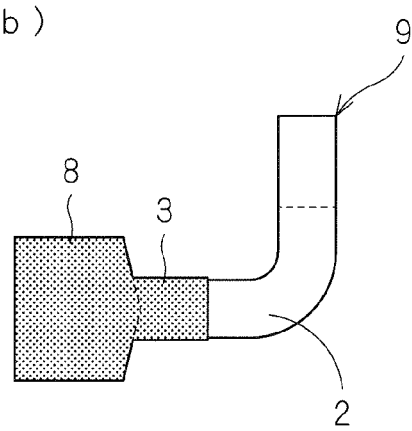
Figure 7:
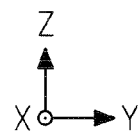

FIG. 7 is a view showing the state of the terminal 9 in a case where the bending axis L1 is located at the center portion in the width direction (Y-axis direction) of the tie bar 2. Part (a) in FIG. 7 is similar to FIG. 6 and thus is not described again here. Part (b) in FIG. 7 shows the terminal 9 that has been subjected to bending on the conditions shown in Part (a) in FIG. 7.

The terminal 9 is bent at the center portion of the tie bar 2 as described above, whereby stable bending accuracy can be achieved even in regions with different cutaway surfaces of terminals (frames) after cutting the tie bar (after the cutting step). In addition, the bending accuracy of the terminal 9 (lead) is improved. Further, the lead formability (bending accuracy) is stable even if a large portion of the tie bar is left in the terminal 9 after the cutting step.

The semiconductor device 100 is manufactured through the semiconductor manufacturing process described above.

As described above, according to this preferred embodiment, a stress by bending is not applied to the resin burr 3 in the bending step. This enables to prevent the resin burr 3 from cracking. Accordingly, the resin burr 3 can be prevented from dropping in bending. This configuration is effective in a case of using a strongly-adherent resin that cannot be removed by hydraulic deburring. Also, dropping of a burr can be prevented in the bending step (lead forming step). This leads to, for example, advantages that the frequency of cleaning a mold decreases and that a mold is free from stress due to the inclusion of foreign matters. That is, it is possible to prevent the occurrence of a malfunction caused by dropping of a resin burr in bending.

<Variation of First Preferred Embodiment>

Figure 8:
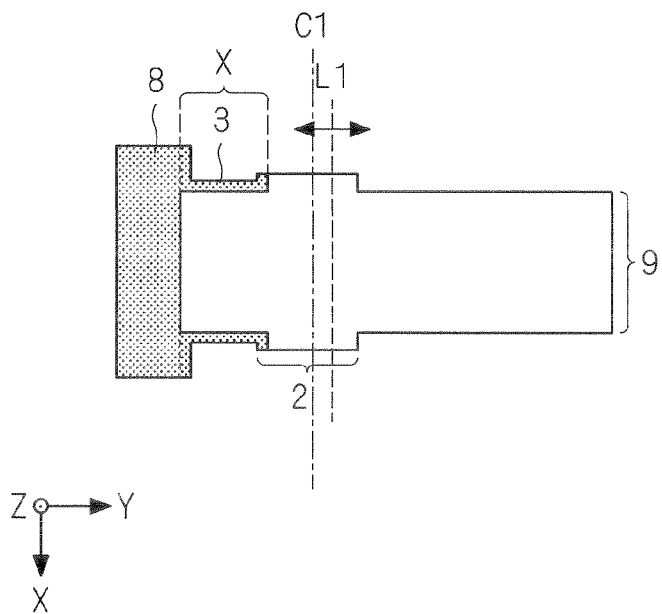
FIG. 8 is a view showing the position of the bending axis in bending.
Figure 8:
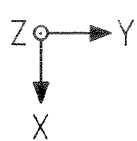

The bending axis in bending may be set at a position below. FIG. 8 is a view showing the position of the bending axis in bending. As shown in FIG. 8, the bending axis L1 in bending of the bending step is set at a position closer to the tip side of the terminal 9 with respect to a center C1 in the width direction (Y-axis direction) of the tie bar 2. In the bending step, the target bending region is located within the tie bar 2 included in the terminal 9 that has been subjected to the cutting step. The width in the Y-axis direction of the tie bar 2 is set such that the above-mentioned outer bending region R1 does not overlap the resin burr region X in which the resin burr 3 is present.

Also in the case of the setting as described above, similar effects to those described above can be achieved. That is, the resin burr 3 can be prevented from dropping in bending. In the bending step, a target bending region is located within the tie bar 2 included in the terminal 9 that has been subjected to the cutting step. Therefore, stable bending accuracy can be achieved.

The width of the tie bar 2 does not need to be particularly set in a case where the bending axis L1 in bending of the bending step is set to a position closer to the tip side of the terminal 9 with respect to the center C1 in the width direction (Y-axis direction) of the tie bar 2.

Accordingly, it is not required to precisely set the accuracy of the position for bending in bending. That is, the accuracy of the position for bending may not be strict. This enables to simplify, for example, various adjustments for performing the bending step. Also in this case, the resin burr 3 can be prevented from dropping in bending.

Second Preferred Embodiment

Also in this preferred embodiment, the semiconductor manufacturing process is performed as in the first preferred embodiment. This preferred embodiment describes the case in which the target bending region is the peripheral region of the tie bar 2 included in the terminal 9 in the bending step (S130). The configuration of the lead frame 1 is similar to that of the first preferred embodiment. That is, the configurations of the tie bar 2 and terminal 9 according to this preferred embodiment are similar to those of the first preferred embodiment.

Figure 9:
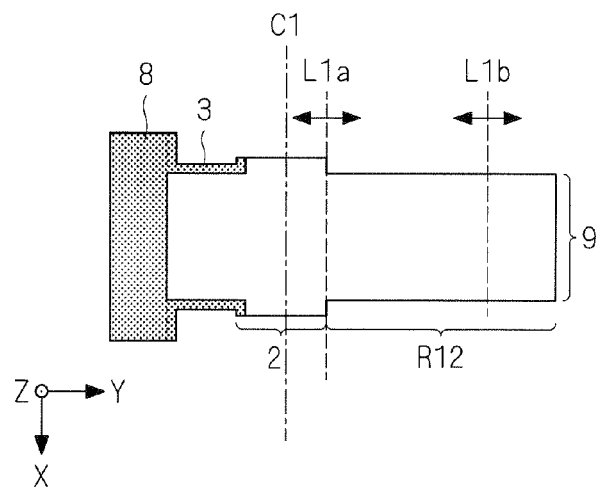
FIG. 9 is a view showing a position of a bending axis in bending according to a second preferred embodiment.

FIG. 9 is a view showing the position of the bending axis in bending according to the second preferred embodiment. In this preferred embodiment, in the bending step, the bending axis in bending is set in the region between the tie bar 2 included in the terminal 9 that has been subjected to the cutting step and the tip of the terminal 9.

Specifically, the bending axis in bending is set at, for example, a position of a bending axis L1a or a position of a bending axis L1b. In a case where the bending axis in bending is set at the position of the bending axis L1b refers to the case where the bending axis in bending is set at the tip portion of the terminal 9.

With the configuration above, similar effects to those of the configuration in FIG. 8 can be achieved. That is, the accuracy of the position for bending may not be strict. This enables to simplify, for example, various adjustments for performing the bending step. Also in this case, the resin burr 3 can be prevented from dropping in bending.

Third Preferred Embodiment

In this preferred embodiment, the terminal 9 (lead) is bent, and then, the position at which the terminal 9 is bent is determined such that the bent region is not included in the resin burr region X. That is, bending is performed such that the target bending region that has been subjected to bending is located at a position at which the target bending region does not overlap the resin burr region X. This preferred embodiment specifically describes the above-mentioned bending with an expression. Also in this preferred embodiment, the semiconductor manufacturing process is performed as in the first preferred embodiment. In this preferred embodiment, the target bending region is located in the region R11 as within Part (a) in FIG. 4.

Figure 10:
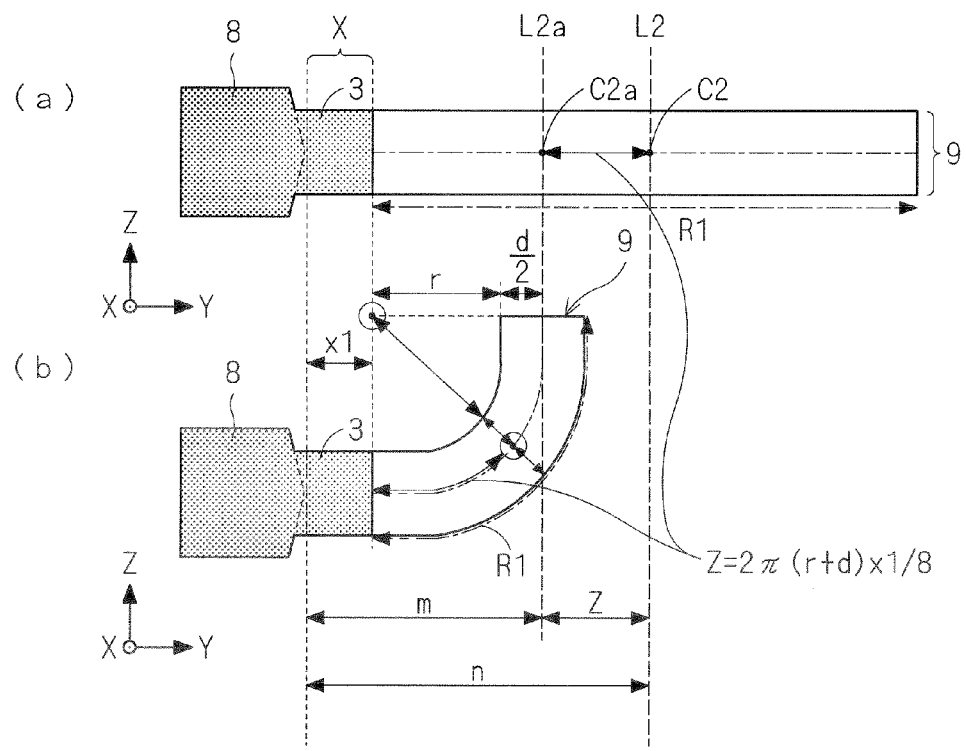
FIG. 10 is a view for describing bending according to a third preferred embodiment.

FIG. 10 is a view for describing bending according to the third preferred embodiment. In FIG. 10, a bending axis L2 is the bending axis in bending of the bending step (S130) according to this preferred embodiment. The bending axis L2 is a center point in a target bending region before bending. Hereinbelow, the point among the center points (bending axis L2) in the target bending region before bending, which is located on the terminal 9, is also referred to as a center point C2.

A bending axis L2a is an axis after the bending axis L2 has moved through bending of the bending step (S130). That is, the bending axis L2a is a center point of the target bending region after bending. Hereinbelow, the point among the center points (bending axis L2a) in the target bending region after bending, which is located on the terminal 9, is also referred to as a center point C2a.

Here, as shown in Part (b) in FIG. 10, the terminal 9 is bent in bending of the bending step (S130). The radius of bending in bending is denoted by r. The thickness of the lead frame 1 (terminal 9) is denoted by d. The distance in the Y-axis direction between the end of the package 8 and the center point in the thickness direction (Y-axis direction) at the tip portion of the terminal 9 after bending is denoted by m. The distance between the center point C2 in the target bending region before bending and the center point C2a in the target bending region after bending is denoted by $Z = 2\pi(r+d) \times \frac{1}{8}$. In Part (b) in FIG. 10, Z is shown in an arc shape. The width in the Y-axis direction of the resin burr region X in which the resin burr 3 is present is denoted by x1. The distance between the end of the package 8 and the center point C2 in the target bending region before bending is denoted by n. In this case, Expression 1 below is satisfied.

$$n = m + Z = x1 + r + d/2 + Z \quad \text{(Expression 1)}$$

In this preferred embodiment, bending is performed such that in the bending step (S130), the center point C2 (bending axis in bending) in the target bending region before bending is located at a position remote from the end of the package 8 by the distance n or more.

Accordingly, the target bending region that has been subjected to bending is located at a position at which the target bending region does not overlap the resin burr region X. This enables to achieve similar effects to those of the first preferred embodiment. That is, the resin burr 3 can be prevented from dropping in bending.

<Other Variations>

The preferred embodiments above may be modified as follows.

In any of the first to third preferred embodiments, the shape of the region to which the resin burr 3 adheres becomes irregular through the sealing step (S110). This is specifically described below with reference to the drawing.

Figure 11:
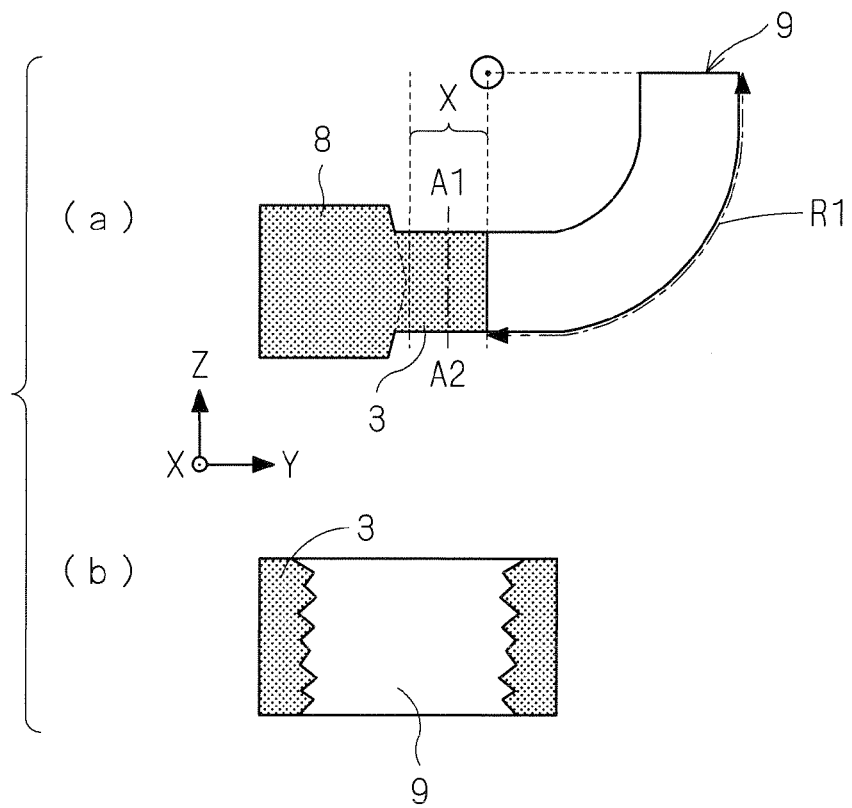
FIG. 11 is a view for describing an irregular shape.

FIG. 11 is a view for describing an irregular shape. Part (a) in FIG. 11 is a side view showing the vicinity of the resin burr region X. Part (b) in FIG. 11 is a cross-sectional view of the terminal 9 taken along the line A1-A2 in Part (a) in FIG. 11.

As shown in Part (b) in FIG. 11, the resin burr region X of the terminal 9, to which the resin burr 3 adheres through the sealing step, has an irregular shape. That is, the region of the terminal 9, which is located on the periphery of the package 8, has an irregular shape. Accordingly, a resin is filled in recesses of the terminal 9, leading to an increase in adhesion owing to the anchor effect.

The above-mentioned configuration is effective in preventing a resin burr from dropping due to a stress when the terminal bending position (bending axis in bending) is adjacent to the resin burr region X. In addition, the above-mentioned configuration is effective in a case where the terminal bending position in the terminal 9 is moved close to the package 8 side for downsizing the package 8. Further, the above-mentioned configuration is effective in a case where the accuracy of the terminal bending position is poor and varies.

The all numerical values used in the above-mentioned preferred embodiments are merely examples for specifically describing the present invention. That is, the numerical values in the present invention are not limited to the numerical values used in the preferred embodiments.

In the present invention, the preferred embodiments and the variations of the preferred embodiments may be freely combined with each other or may be appropriately modified or omitted within the scope of the present invention.

The present invention can be used as a method of manufacturing a semiconductor device capable of preventing a resin burr from dropping in bending.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
    sealing an inner lead of a lead frame with a resin;
    bending a target bending region in which a stress by bending is not applied to a resin burr generated in said step of sealing, said target bending region being subjected to bending in at least one terminal included in said lead frame; and
    cutting a tie bar located between neighboring two of said terminals, said tie bar connecting said plurality of terminals included in said lead frame, and said target bending region is located in said tie bar included within said terminal;
    wherein each of said terminals becomes an independent terminal including the tie bar through said step of cutting.

2. The method of manufacturing a semiconductor device according to claim 1, wherein
    the width of said tie bar is set to a size such that, of said target bending region, an outer bending region having a large radius of curvature by said bending does not overlap a region in which said resin burr is present.

3. The method of manufacturing a semiconductor device according to claim 2, wherein a bending axis in said bending is a center portion in a width direction of said tie bar.

4. The method of manufacturing a semiconductor device according to claim 2, wherein a bending axis in said bending is set at a position closer to a tip side of said terminal with respect to the center in a width direction of said tie bar.

5. The method of manufacturing a semiconductor device according to claim 1, wherein a bending axis in said bending is set at a tip portion of said terminal.

6. The method of manufacturing a semiconductor device according to claim 1, wherein
    said terminal is bent in said bending,
    said target bending region subjected to said bending is located at such a position as not to overlap a region in which said resin burr is present,
    a package is formed in said step of sealing,
    said resin burr is formed adjacent to said package,
    a relational expression $n=m+Z=x1+r+d/2+Z$ is satisfied in a case where r represents the radius of bending in said bending, d represents the thickness of said lead frame, m represents the distance between an end of said package and a center point in a thickness direction at a tip portion of said terminal after said bending, $Z=2\pi(r+d)\times\frac{1}{8}$ represents the distance between a center point in said target bending region before said bending and the center point in said target bending region after said bending, x1 represents the width of a region in which said resin burr is present, and n represents the distance between said package and the center point in said target bending region before said bending, and
    said bending is performed such that the center point in said target bending region before said bending is located at a position remote from the end of said package by the distance n or more.

7. The method of manufacturing a semiconductor device according to claim 1, wherein a region to which said resin burr adheres through said step of sealing has an irregular shape.

8. A semiconductor device manufactured by the method of manufacturing a semiconductor device according to claim 1.

9. A method of manufacturing a semiconductor device, comprising the steps of:
    sealing an inner lead of a lead frame with a resin; and
    bending a target bending region in which a stress by bending is not applied to a resin burr generated in said step of sealing, said target bending region being subjected to bending in at least one terminal included in said lead frame; wherein
    said terminal is bent in said bending;
    said target bending region subjected to said bending is located at such a position as not to overlap a region in which said resin burr is present;
    a package is formed in said step of sealing;
    said resin burr is formed adjacent to said package;
    a relational expression $n=m+Z=x1+r+d/2+Z$ is satisfied in a case where r represents the radius of bending in said bending, d represents the thickness of said lead frame, m represents the distance between an end of said package and a center point in a thickness direction at a tip portion of said terminal after said bending, $Z=2\pi(r+d)\times\frac{1}{8}$ represents the distance between a center point in said target bending region before said bending and the center point in said target bending region after said bending, x1 represents the width of a region in which said resin burr is present, and n represents the distance between said package and the center point in said target bending region before said bending; and said bending is performed such that the center point in said target bending region before said bending is located at a position remote from the end of said package by the distance n or more.

10. The method of manufacturing a semiconductor device according to claim 9, wherein a bending axis in said bending is set in a region between said tie bar included in said terminal and a tip of said terminal.

\* \* \* \* \*